Figure 1:
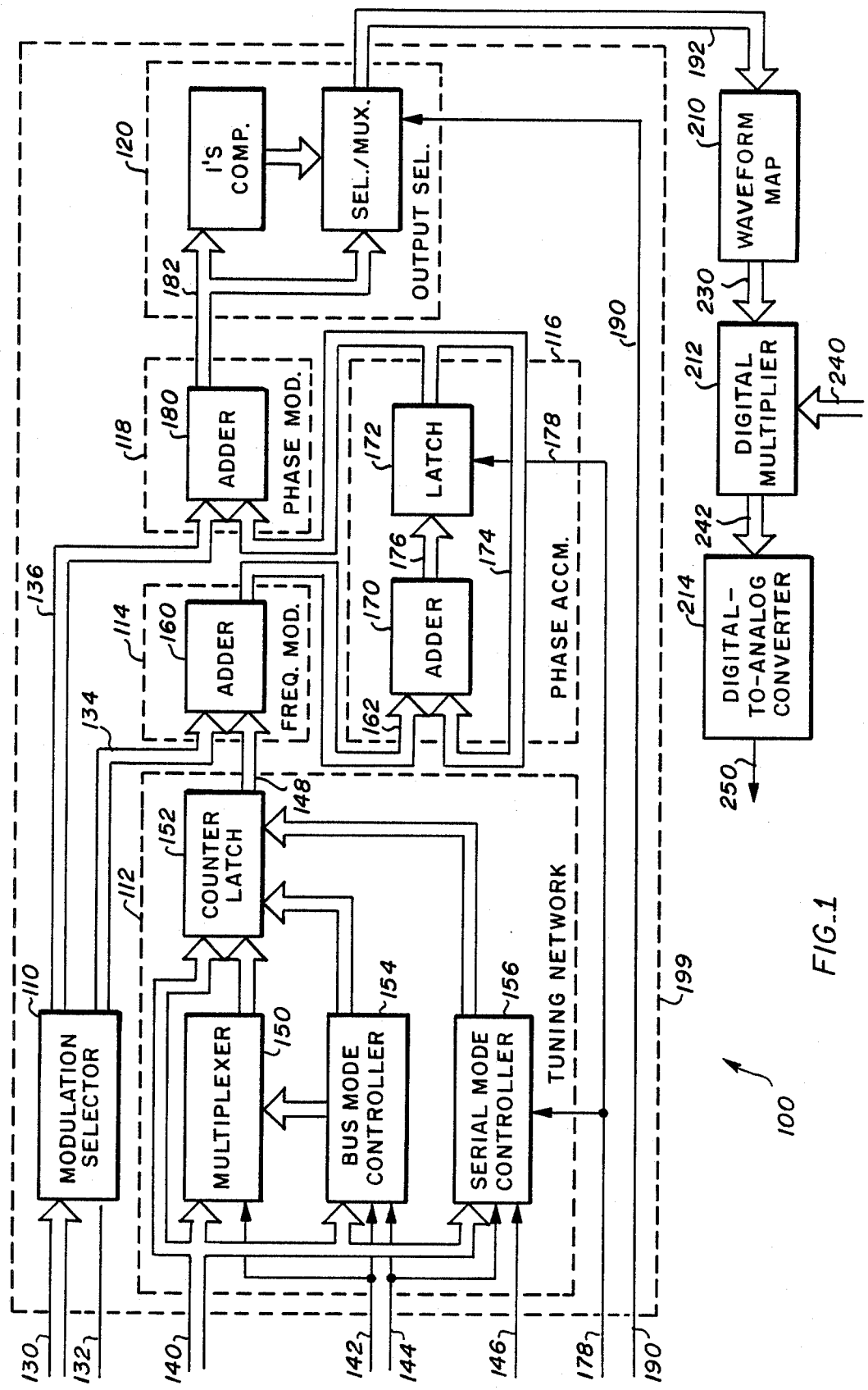

United States Patent [19]

McCune, Jr.

[11] Patent Number: 4,746,880
[45] Date of Patent: May 24, 1988

[54] NUMBER CONTROLLED MODULATED OSCILLATOR

[75] Inventor: Earl W. McCune, Jr., Santa Clara, Calif.

[73] Assignee: Digital RF Solutions Corporation, Santa Clara, Calif.

[21] Appl. No.: 11,613

[22] Filed: Feb. 6, 1987

[51] Int. Cl.[4] .......................... H03C 1/00; H03C 3/00
[52] U.S. Cl. ................................ 332/16 R; 332/9 R; 332/22; 332/41
[58] Field of Search ................. 332/9 R, 16 R, 22, 41; 328/14

[56] References Cited

U.S. PATENT DOCUMENTS

| | | | |
|---|---|---|---|
| 3,633,017 | 1/1972 | Crooke et al. | 364/721 |
| 4,003,003 | 1/1977 | Haeberlin | 332/22 X |
| 4,652,832 | 3/1987 | Jasper | 364/721 |

Primary Examiner—Eugene R. LaRoche
Assistant Examiner—Robert J. Pascal
Attorney, Agent, or Firm—Thomas E. Schatzel

[57] ABSTRACT

Disclosed is a number controlled, modulated, oscillator employing a modulation selector for receiving a digital number for use for frequency modulation or for phase modulation, a tuning network for receiving another digital number in a variety of forms, and a frequency modulator for adding the value of the modulation selector number to that of the tuning network number. Also, the oscillator employs a phase accumulator for adding the value of the frequency modulator sum to that of a number already stored in the phase accumulator and replacing the stored number with the phase accumulator sum at each of a series of times specified by a clocking signal. Further, the oscillator employs a phase modulator for adding the value of the number stored in the phase accumulator to that of the modulation selector number and an output selector developing the 1's compliment of the phase modulator sum and for selecting either the phase modulator sum or the complimented number. Finally, the oscillator employs a waveform map for storing a quantity of amplitude numbers and for retrieving the number stored at the location addressed by the (modulated) phase accumulator selected number, a digital multiplier for receiving a number and for multiplying the value of the received number by that of the retrieved number, and a digital-to-analog converter for developing a signal having, as an amplitude, the multiplier product.

9 Claims, 1 Drawing Sheet

NUMBER CONTROLLED MODULATED OSCILLATOR

TECHNICAL FIELD

The present invention relates to electronic oscillators generally and more specifically to an oscillator for generating a signal having a numerically controlled frequency, a numerically controlled phase, a programmable shape, and a numerically controlled amplitude.

BACKGROUND ART

A waveform map (ROM) having addressing inputs connected to receive signals developed by a counter and data outputs connected to drive a digital-to-analog converter (DAC or D/A) is shown in the U.S. Pat. No. 4,039,806 of O. Fredriksson and E. Thomas, the U.S. Pat. No. 4,192,007 of D. Becker, the U.S. Pat. No. 4,283,768 of R. Scott, and the U.S. Pat. No. 4,301,415 of D. McFayden. The ROM (22) (waveform map) shown in the O. Fredriksson and E. Thomas patent stores a number of binary words, each of which represents a discrete amplitude or argument of a sinusoid to be generated as a function of time. In FIG. 3 of the O. Fredriksson and E. Thomas patent, a circle is shown to illustrate addressing operations for various phase values. The text of the O. Fredriksson and E. Thomas patent (column 3, lines 11-32) directs "(1)et X(t) represent a continuous sinusoid of frequency $f_o$. Then, $$X(t) = A \sin 2(pi)f_o t = A \sin \frac{2(pi)t}{T} \quad (1)$$

where $f_o$ is frequency and T is the period. When (1) is expressed discretely, it becomes X(n):

$$X(n) = A \sin \frac{2(pi)n}{360} \quad (2)$$

Of course, X(n) is the value of the function throughout the nth interval; in the case of interest each n interval is preferably made one degree long.

Each separate arc of phase circle (16 of FIG. 3) defines a selected sinusoid argument. The argument is generated as a function of discrete time intervals, T/360. However, its exact digital representation, say as set forth in equation (2), is also a function of storage available within the sin wave generator (14 of FIG. 2).

A (phase) accumulator is disclosed in the U.S. Pat. No. 3,689,914 which issued to J. Butler. In FIG. 1 of the J. Butler patent, the (phase) accumulator is shown as a block (16) driven both by a digital generator (12) and a clock (20) and driving a digital-to-analog converter (18) to generate, at the output of the converter, a signal having either a triangular or sawtooth shape.

In FIG. 2 of the J. Butler patent, a four stage (phase) accumulator is shown to include four full adders (32-38) and five J-K flip-flops (40-48). The adders are connected in cascade with the carry output of one adder connected to the carry input of the next adder. One of the two addend inputs of each of the adders is connected to the digital generator; and, the two, complementary, outputs of each of the adders are connected to the J and K inputs, respectively, of the corresponding one of four of the flip-flops. The fifth flip-flop is configured with the J input directly connected to the carry output of the fourth adder and the K input coupled thereto by an inverter (60). The T input of each of the flip-flops is connected to the corresponding one of five outputs of a time patch (58) which is driven by the clock. The output of each of the flip-flops is connected to the other one of the addend inputs of the corresponding adder to provide feedback. It is indicated that at each clock pulse of the clock, the accumulator adds the value of the binary number applied thereto to a number already stored therein and replaces the stored number with the sum (column 2 lines 20-24).

Additionally, the J. Butler (phase) accumulator is shown to include four exclusive OR gates (50-56) (forming a 1's complement circuit). Specifically, one of the two inputs of each of the exclusive OR gates is connected to the output of the corresponding one of the four flip-flops; and, the output of each of the flip-flops is connected to the digital-to-analog converter. The other input of each of the exclusive OR gates is connected to a line which is selectively coupled by a switch (22) either to the output of the fifth flip-flop or to circuit ground to select either the triangular or sawtooth signal shape.

The J. Butler (phase) accumulator (arithmetic synthesizer) is included (as a pair of blocks 16 and 20) in the U.S. Pat. Nos. 4,021,757 and 4,114,110, both of E. Nossen. In FIG. 3 of the U.S. Pat. No. 4,114,110, a frequency register (20) of the arithmetic synthesizer (phase accumulator) is shown as a block being driven both by fine frequency selecting signal(s) and by signal(s) developed by an analog-to-digital converter (19) (block) from an analog signal(s).

A numerically controlled oscillator (NCO) (phase accumulator) is shown in FIG. 1 of the U.S. Pat. No. 4,514,696 of T. Genrich to include a parallel digital adder (12) and a register (14). The adder is shown to have a first set of addend inputs connected to a set of input terminals (10), a second set of addend inputs, and a set of outputs. The register is shown to have a set of inputs connected to the set of outputs of the adder, an input connected to a terminal (16), and a set of outputs connected both to a set of output terminals (18) and to the second set of adder addend inputs.

It is indicated in the T. Genrich patent that the adder and register are each N bits wide. Further, it is indicated (column 3, lines 32-64) that "(o)ne input word to the adder is an N bit word indicative of a desired frequency called FREQ. The register is used to hold the result of the last addition. It is updated at a rate determined by pulses applied to terminal 16. Thus, the NCO is an accumulator that is incremented at a rate determined by the frequency of the clock input and the magnitude of the FREQ digital word. These values are related by the equation, $$F_{OUTPUT} = F_{CK} \frac{FREQ}{2^N} \quad (1)$$

where:

$F_{OUTPUT}$=the toggle rate of the most significant output bit at terminals 18, $F_{CK}$=the frequency of the input clock applied to terminal 16, N=the bit capacity of adder 12, and FREQ=the numerical value of the input word FREQ, where $$0 \leq FREQ \leq 2^{N-1}. \quad (2)$$

Therefore, $$0 \leq F_{OUTPUT} \leq \frac{F_{CK}}{2} \quad (3)$$

in steps of $$\frac{F_{CK}}{2^N}." \quad (4)$$

In the article by D. Sunderland, R. Strauch, S. Wharfield, H. Peterson, and C. Cole which appeared on pages 497–506 of the August 1984 edition (Volume SC-19, Number 4) of the "IEEE Journal of Solid-State Circuits," there is shown (in FIG. 2) a number of blocks. Shown are a pair of adders driving a pair of registers (to form a phase accumulator) driving a 1's complement circuit driving a pair of ROMs driving another pair of registers driving another adder driving another 1's complement circuit driving still another register.

The reader may also find of interest the U.S. Pat. No. 4,388,597 of R. Bickley and A. Hunt and the U.S. Pat. No. 4,516,084 of A. Crowley.

DISCLOSURE OF THE INVENTION

The primary object of the present invention is to provide an oscillator for generating a signal having a numerically controlled frequency, a numerically controlled phase, a programmable shape, and a numerically controlled amplitude.

Another object of the present invention is to provide an oscillator at least a portion of which is suitable for integration into a single device using CMOS technology.

Still another object of the present invention is to provide a fast oscillator for generating a signal having a numerically controlled frequency, a numerically controlled phase, a programmable shape, and a numerically controlled amplitude.

Briefly, the presently preferred embodiment of a number controlled, modulated, oscillator in accordance with the present invention employs a modulation selector for receiving a digital number for use for frequency modulation or for phase modulation, a tuning network for receiving another digital number in a variety of forms, and a frequency modulator for adding the value of the modulation selector number to that of the tuning network number. Also, the oscillator employs a phase accumulator for adding the value of the frequency modulator sum to that of a number already stored in the phase accumulator and replacing the stored number with the phase accumulator sum at each of a series of times specified by a clocking signal. Further, the oscillator employs a phase modulator for adding the value of the number stored in the phase accumulator to that of the modulation selector number and an output selector developing the 1's compliment of the phase modulator sum and for selecting either the phase modulator sum or the complimented number. Finally, the oscillator employs a waveform map for storing a quantity of amplitude numbers and for retrieving the number stored at the location addressed by the (modulated) phase accumulator selected number, a digital multiplier for receiving a number and for multiplying the value of the received number by that of the retrieved number, and a digital-to-analog converter for developing a signal having, as an amplitude, the multiplier product.

These and other objects of the present invention will no doubt become apparent to those skilled in the art after having read the detailed description of the presently preferred embodiment of the present invention which is illustrated in the FIGURE of the drawing.

BRIEF DESCRIPTION OF THE FIGURE IN THE DRAWING

FIG. 1 is a block diagram of a number controlled, modulated, oscillator in accordance with the present invention.

BEST MODE FOR CARRYING OUT THE INVENTION

The presently preferred embodiment of a number controlled, modulated, oscillator in accordance with the present invention is illustrated in FIG. 1 of the drawing generally designated by the number 100. Oscillator 100 employs a modulation selector 110, a tuning network 112, a frequency modulator 114, a phase accumulator 116, a phase modulator 118, and an output selector 120.

Modulation selector 110 is connected to a 24-line, input, bus 130, to receive externally developed signals the state of which represent a 24-bit, binary, number and to an input line 132 to receive an externally developed selecting signal, the state of which specifies the modulation type. In addition, selector 110 is connected to a 24-line bus 134 upon which it develops signals for driving frequency modulator 114 and to a 24-line bus 136 upon which it develops signals for driving phase modulator 118. Selector 110 develops the signals on buses 134 and 136 so as to couple the number either to bus 134 or to bus 136 as selected by the state of the signal developed on line 132.

For this purpose, selector 110 includes 24 gating circuits and an inverter (which, for clarity, are not shown). Each of the gating circuits has a first and a second 2-input AND gate. The first AND gate is configured with one of the inputs connected to the input of the inverter, with the other input connected to the corresponding line of the 24 lines of bus 130 and with the output connected to the corresponding line of the 24 lines of bus 134. The second AND gate is configured with one of the inputs connected to the output of the inverter, with the other input also connected to the corresponding line of the 24 lines of bus 130 and with the output connected to the corresponding line of the 24 lines of bus 136. The input of the inverter is, additionally, connected to line 132.

Tuning network 112 is connected to receive signals externally developed on a 24-line bus 140 and three lines, respectively designated 142, 144, and 146. Also, network 112 is connected to a 24-line bus 148 upon which it develops signals representing a 24-bit binary number for driving frequency modulator 114.

Network 112 operates in three modes as selected by the state of the signals externally developed on lines 142 and 144. In a parallel mode (selected when a high-logic-level signal is developed on line 142), network 112 develops the signals on bus 148 so as to couple to bus 148 a 24-bit, binary, number represented by the state of the signals developed on the 24 lines of bus 140.

In a bus mode (selected when a low-logic-level signal is developed on line 142), network 112 develops the signals on the 24 lines of bus 148 so as to represent a 24-bit, binary, number stored in the network. In that (bus) mode, the stored number is updated (stored) eight bits (one byte) at a time. More specifically, the portion (byte) of the stored number which is selected by the state of the signals developed on the ninth and tenth order lines of bus 140 is replaced by the byte represented by the state of the signals developed on the eight lowest order lines of bus 140 at the time delineated by the state of the signal developed on the eleventh order line of bus 140.

Similarly, in a serial mode, (selected when a low-logic-level signal is developed on line 144) network 112 develops the signals on the 24 lines of bus 148 so as to represent the 24-bit, binary, number stored in the network. However, in the serial mode, the stored number is updated (stored) one bit at a time, so as to be compatible with signals generated by an optical encoder.

An optical encoder generates signals which indicate the angular rotation of a shaft. Generated are a pair of square-wave signals which are in phase quadrature (separated by a quarter of a cycle, 90 electrical degrees). Each change of state of the square-wave signals delineates a predetermined angular rotation of the shaft. The relative phase of the signals (whether the first signal leads, or lags, the second) delineates the direction of rotation. Thus, if a change of state of a first one of the signals occurs while the state of the other (second) one of the signals is in a high state, a predetermined angular rotation of the shaft has occurred. If the transition is high-to-low, the rotation was in one direction; and, if the transition is low-to-high, the rotation was in the other direction. In the serial mode, the two square-wave signals are externally generated each on the respective one of the nineteenth and twentieth order lines of the 24 lines of bus 140.

More specifically, tuning network 112 includes a multiplexer 150, a counter latch 152, a bus mode controller 154, and a serial mode coantroller 156. Multiplexer 150 has a first and a second quadruple 2-line-to-1-line data selecting/multiplexing circuit, each of which is similar to those that are commonly designated 74157 (which, for clarity, are not shown). The first 74157-type circuit is configured with the set of eight A data inputs connected each to the respective one of the eight lowest order lines of the 24 lines of bus 140 and with the set of eight B data inputs connected each to the respective one of the eight highest order lines of the 16 lowest order lines of the 24 lines of bus 140. The second 74157-type circuit is configured with the set of eight A data inputs also connected each to the corresponding one of the eight lowest order lines of the 24 lines of bus 140 and with the set of eight B data inputs connected each to the respective one of the eight highest order lines of the 24 lines of bus 140. The select input of each of the 74157-type circuits is connected to line 142.

Counter latch 152 has six (three pair of) presettable up/down counting circuits (not shown), each of which is similar to those that are commonly designated 74191. The first 74191-type circuit is configured with the set of four data inputs (A,B,C, and D) connected, each to the respective one of the four lowest order lines of the 24 lines of bus 140. The second 74191-type circuit is configured with the set of four data inputs connected, each to the respective one of the four highest order lines of the eight lowest order lines of the 24 lines of bus 140. The third 74191-type circuit is configured with the set of four data inputs connected, each to the respective one of the four lowest order outputs of the eight Y outputs of the first 74157-type circuit of multiplexer 150. The set of four data inputs of the fourth 74191-type circuit of counter latch 152 are connected, each to the respective one of the four highest order outputs of the eight Y outputs of the first 74157-type circuit of multiplexer 150; the set of four data inputs of the fifth 74191-type circuit are connected, each to the respective one of the four lowest order outputs of the eight Y outputs of the second 74157-type circuit; and, the set of four data inputs of the sixth 74191-type circuit are connected, each to the respective one of the four highest order outputs of the eight Y outputs of the second 74157-type circuit. The enable input of each of the 74191-type circuits of counter latch 152 is connected to line 144; and, the data outputs (QA, QB, QC, and QD) of the 74191-type circuits (24 in all) are connected, each to the respective line of the 24 lines of bus 148. The other inputs/outputs of the 74191-type circuits are connected, as will become apparent shortly.

Bus mode controller 154 has a first and a second inverter, a first and a second 3-input NAND gate, a 2-line-to-4-line decoding/demultiplexing circuit, which is similar to those that are commonly designated 74139, and a quadrupole 2-line-to-1-line data selecting/multiplexing circuit, which is also similar to those that are commonly designated 74157 (not shown). The first NAND gate is configured with one of the inputs coupled by the first inverter to line 142, with another of the inputs coupled by the second inverter to the eleventh order line of the 24 lines of bus 140 to receive the enabling signal developed thereon in the bus mode, and with the remaining input connected to line 144. The second NAND gate is configured with two of the inputs connected to line 142 and with the remaining input connected to line 144. The 74139-type circuit is configured with the (active low) enabling input connected to the output of the first NAND gate and with the two selecting inputs (A and B) connected each to the respective one of the ninth and tenth order lines of the 24 lines of bus 140 to receive the bus address selecting signals externally developed thereon in the bus mode. The 74157-type circuit of controller 154 is configured with the three lowest order inputs of the four A data inputs connected each to the respective one of the three lowest order Y outputs of the 74139-type circuit, with the (active low) strobe (G) input connected to the output of the second NAND gate, and with the select input connected to the output of the first NAND gate. In addition, the three lowest order Y outputs of the 74157-type circuit of controller 154 are connected, the lowest order to the (active low) load input of the first and second 74191-type circuits of counter latch 152, the next to the load input of the third and fourth 74191-type circuits, and the third to the load input of the fifth and sixth 74191-type circuits.

Serial mode controller 156 has a first and a second buffer and a first, a second, and a third D-type flip-flop (each of which is similar to those that are commonly designated 7474) (not shown). The first D-type flip-flop is configured with the D input coupled by the first buffer and the clock input coupled by the second buffer each to the respective one of the nineteenth and twentieth order lines of the 24 lines of bus 140 to receive the two square-wave signals which are externally generated thereon in the serial mode. The Q output of the first D-type flip-flop is connected to the up/down input of each of the six 74191-type counting circuits of counter latch 152. In this configuration, when the square-wave signal generated on the nineteenth order line of bus 140 leads in phase the square-wave signal generated on the twentieth order line of bus 140, a low-logic-level signal is developed at the Q output of the first D-type flip-flop enabling the clocked one of the 74191-type circuits to count up and vice versa.

To provide a delay while the first flip-flop and the 74191-type circuit settle, the second and third D-type flip-flops are configured each with the clocking input connected to receive an oscillator 100 clocking signal (discussed in conjunction with phase accumulator 116). The D input of the second flip-flop is connected to the output of the second buffer; and, the D input of the third flip-flop is connected to the Q output of the second flip-flop.

In addition, serial mode controller 156 has an inverter, a first and a second buffer, a 2-line-to-4-line decoding/demultiplexing circuit, which is similar to those that are commonly designated 74138, six more inverters, six AND-NOR gates, which are similar to those that are commonly designated 7424, and six 2-input NAND gates, all configured to provide a selectable shaft rotation sensitivity (not shown). (The 7424-type gates each use a first and a second 2-input AND gate and a 2-input NOR gate. The two inputs of the NOR gate are connected, each to the output of the respective one of the two AND gates. The two inputs of the first AND gate form the first set of two inputs of the 7424-type circuit; and, the two inputs of the second AND gate form the second set of two inputs of the 7424-type circuit. The output of the NOR gate forms the output of the 7424-type circuit.)

The enable input of the 74138-type circuit is coupled by one of the inverters to line 142; and the three selecting inputs (A, B, and C) are connected, each to the respective one of the sixteenth, seventeenth, and eighteenth order lines of the 24 lines of bus 140 to receive shaft rotation sensitivity selecting signals that are externally developed thereon. The lowest and highest order Y outputs of the 74138-type circuit are not used. The other six of the eight Y outputs of the 74138-type circuit are each connected to one of the first set of inputs of the respective one of the six 7424-type gates and coupled by the respective one of the other six inverters to one of the second set of inputs of the respective one of the six 7424-type gates. (The other input of the first set of inputs of the first 7424-type gate is connected to line 146 to receive a carry signal developed by another oscillator (which is similar to oscillator 100) when the two oscillators are connected in cascade.) The other input of the first set of inputs of each of the other five (the second through sixth) 7424-type circuits is connected to the carry output of the respective one of the five lowest order circuits of the six 74191-type circuits of counter latch 152. (The carry output of the highest order circuit of the six 74191-type circuits of counter latch 152 is used to drive still another oscillator (which is similar to oscillator 100.)) The other input of the second set of inputs of the 7424-type gates are connected to the Q output of the third flip-flop. One input of each of the six NAND gates is connected to the enable input of the 74138-type circuit. The other input of each of the six NAND gates is connected to the output of the corresponding one of the six 7424-type gates; and, the output of each of the six NAND gates is connected to the clocking input of the corresponding one of the six 74191-type circuits of counter latch 152.

Frequency modulator 114 includes a 24-bit adder 160 configured with the 24 inputs of one of the sets of addend inputs connected, each to a corresponding one of the 24 lines of bus 134, with the 24 inputs of the other one of the sets of addend inputs connected, each to a corresponding one of the 24 lines of bus 142, and with the set of 24 sum outputs connected, each to a corresponding line of a 24-line bus 162.

Phase accumulator 116 includes a 24-bit adder 170 and a 24-bit latch 172. Adder 170 is configured with the 24 inputs of one of the sets of addend inputs connected, each to a corresponding one of the 24 lines of bus 162, with the 24 inputs of the other one of the sets of addend inputs connected, each to a corresponding line of a 24-line bus 174, and with the set of 24 sum outputs connected, each to a corresponding line of a 24-line bus 176. The set of 24 data inputs of latch 172 are each connected to a corresponding one of the 24 lines of bus 176; and, the set of 24 data outputs of the latch are each connected to a corresponding one of the 24 lines of bus 174. The clock input of latch 172 is connected to a line 178 to receive a system clocking signal externally generated thereon.

Phase modulator 118 includes a 24-bit adder 180 configured with the 24 inputs of one of the sets of addend inputs connected, each to a corresponding one of the 24 lines of bus 136 and with the 24 inputs of the other one of the sets of addend inputs connected, each to a corresponding one of the 24 lines of bus 174. Of the set of 24 sum outputs of adder 180, only the 12 highest order outputs are used. These 12 highest order outputs of adder 180 are connected, each to a corresponding line of a 12-line bus 182.

Output selector 120 is connected to the 12 lines of bus 182, to a line 190 to receive an externally developed output selecting signal, and to a 12-line, output, bus 192. Selector 120 operates in two modes as selected by the state of the signal externally developed on line 190. In a full-circle mode, selector 120 develops signals on bus 192 so as to couple to the bus the (12-bit, binary) number represented by the state of the signals developed on bus 182. In a half-circle mode, selector 120 develops the signals on bus 192 so as to couple to the bus the 11-bit binary number represented by the state of the signals developed on the lowest 11 order lines of the 12 lines of bus 182 when the state of the signal developed on the highest order line of bus 182 has a low-logic level. When the signal developed on the highest order line of the 12 lines of bus 182 has a high-logic level, selector 120 develops the signals on bus 192 so as to represent the 1's compliment of the number represented by the state of the signals developed on the lowest 11 order lines of bus 182.

For this purpose, selector 120 includes 11 exclusive OR gates (not shown) forming a 1's compliment circuit. More specifically, one of the two inputs of each of the exclusive OR gates is connected to the corresponding one of the 11 lowest order lines of the 12 lines of bus 182. The other input of each of the exclusive OR gates is connected to the highest order line of the 12 lines of bus 182.

In addition, selector 120 includes a 2-line-to-1-line data selecting/multiplexing circuit. The circuit is configured with the set of A data inputs connected, each to the corresponding one of the 12 lines of bus 182, with the set of B data inputs connected, each to the output of the respective one of the exclusive OR gates of selector 120, with the Y outputs connected, each to the corresponding one of the 12 lines of bus 192, and with the select input connected to line 190.

In the presently preferred embodiment, all of the above mentioned components of oscillator 100 (a modulation selector 110, tuning network 112, frequency modulator 114, phase accumulator 116, phase modulator 118, and output selector 120) are all integrated into a single device (199) using CMOS technology.

Additionally, oscillator 100 employs a waveform map 210, a digital multiplier 212, and a digital-to-analog converter 214. In the presently preferred embodiment, waveform map 210 includes a programmable, read only memory (PROM) device of the type which is designated CY7C291 by Cypress Semiconductors Inc. The PROM is configured with the address inputs each connected to the respective line of the lines of bus 192 and with the data outputs each connected to the respective line of a bus 230. Stored at locations in the PROM is a list of waveform amplitudes (digital numbers) as a function of oscillator angle (map). In another embodiment, waveform map 210 includes a dual-port random access memory storing the map.

Digital multiplier 212, in the presently preferred embodiment, includes either a digital multiplying device of the type which is designated LMU08 (signed) or one which is designated LMU8U (unsigned), both by Logic Devices Inc. The multiplying device is configured with one set of data inputs connected, each to the respective line of the lines of bus 230, with the other set of data inputs connected, each to the respective line of a bus 240 to receive signals representing an amplitude that are externally developed on the bus, and with the data outputs connected, each to the respective line of a bus 242.

Digital-to-analog converter 214, in the presently preferred embodiment, includes a converting device of the type which is designated AM6012 by Advanced Micro Devices Inc. The converter device is configured with the data inputs connected, each to the respective line of bus 242 and with the data output connected to a line 250.

It is contemplated that after having read the preceeding disclosure, certain alterations and modifications of the present invention will no doubt become apparent to those skilled in the art. It is therefore intended that the following claims be interpreted to cover all such alterations and modifications as fall within the true spirit and scope of the invention.

What is claimed is:

1. An oscillator comprising in combination:
    a frequency modulator including an adder having a first set of addend inputs for receiving signals representing a first digital number, a second set of addend inputs for receiving signals representing a second digital number, and a set of outputs at which said frequency modulator adder develops signals representing the sum of the value of said first and said second numbers;
    a phase accumulator including an adder having a first set of addend inputs connected to said set of outputs of said frequency modulator adder for receiving said frequency modulator adder developed sum signals, a second set of addend inputs for receiving signals representing a stored number, and a set of outputs at which said phase accumulator adder develops signals representing the sum of the value of said frequency modulator adder developed sum and said stored number and a latch having a set of data inputs connected to said set of outputs of said phase accumulator adder for receiving said phase accumulator adder developed sum signals, a clock input for connection to receive an externally generated clocking signal, and a set of data outputs connected to said second set of phase accumulator adder addend inputs, said phase accumulator latch for latching the state of said phase accumulator adder developed sum signals at each of a series of times delineated by said clocking signal to develop said stored number signals;
    a phase modulator including an adder having a first set of addend inputs for receiving signals representing a third digital number, a second set of addend inputs connected to said set of outputs of said phase accumulator latch for receiving said stored number signals, and a set of outputs at which said phase modulator adder develops signals representing the sum of the value of said third number and the value of said stored number; and
    a modulation selector for connection to receive externally generated signals representing a fourth digital number, for connection to receive an externally generated selecting signal, connected to said first set of frequency modulator adder addend inputs, and connected to said first set of phase modulator adder addend inputs, said modulation selector for developing said first digital number signals and said third digital number signals so that the value of one of said first and said third numbers is the same as the value of said fourth number as determined by the state of said selecting signal.

2. An oscillator as recited in claim 1 further comprising a tuning network connected to said second set of frequency modulator adder addend inputs, said tuning network including means for storing said second digital number and for developing said second digital number signals and means for updating a selected portion of said stored number.

3. An oscillator as recited in claim 1 further comprising a waveform map coupled to receive signals derived from said phase modulator adder sum signals, said waveform map including a predetermined number of storage locations each storing a number, said waveform map for developing signals representing the number stored at the location addressed by said signals derived from said phase modulator adder sum signals.

4. An oscillator as recited in claim 3 further comprising a digital multiplier including a first set of inputs connected to said waveform map for receiving said stored number signals a second set of inputs for connection to receive externally developed signals representing a fifth number, said digital multiplier for developing signals representing the product of the value of said stored number and the value of said fifth number.

5. An oscillator as recited in claim 3 further comprising a digital-to-analog converter coupled to receive signals derived from said waveform map stored number signals.

6. An oscillator comprising in combination:
    a frequency modulator including an adder having a first set of addend inputs for receiving signals representing a first digital number, a second set of addend inputs for receiving signals representing a second digital number, and a set of outputs at which said frequency modulator adder develops signals representing the sum of the value of said first and said second numbers;

a phase accumulator including an adder having a first set of addend inputs connected to said set of outputs of said frequency modulator adder for receiving said frequency modulator adder developed sum signals, a second set of addend inputs for receiving signals representing a stored number, and a set of outputs at which said phase accumulator adder develops signals representing the sum of the value of said frequency modulator adder developed sum and said stored number and a latch having a set of data inputs connected to said set of outputs of said phase accumulator adder for receiving said phase accumulator adder developed sum signals, a clock input for connection to receive an externally generated clocking signal, and a set of data outputs connected to said second set of phase accumulator adder addend inputs, said phase accumulator latch for latching the state of said phase accumulator adder developed sum signals at each of a series of times delineated by said clocking signal to develop said stored number signals;

a phase modulator including an adder having a first set of addend inputs for receiving signals representing a third digital number, a second set of addend inputs connected to said set of outputs of said phase accumulator latch for receiving said stored number signals, and a set of outputs at which said phase modulator adder develops signals representing the sum of the value of said third number and the value of said stored number; and an output selector connected to said set of phase modulator adder outputs for receiving said phase modulator adder developed sum signals, said output selector including means for developing a number the value of which is the 1's compliment of at least a portion of said phase modulator adder sum and means for developing signals representing a selected one of said phase modulator adder sum and said 1's compliment number.

7. An oscillator as recited in claim 6 further comprising a modulation selector for connection to receive externally generated signals representing a fourth digital number, for connection to receive an externally generated selecting signal, connected to said first set of frequency modulator adder addend inputs, and connected to said first set of phase modulator adder addend inputs, said modulation selector for developing said first digital number signals and said third digital number signals so that the value of one of said first and said third numbers is the same as the value of said fourth number as determined by the state of said selecting signal.

8. An oscillator as recited in claim 6 further comprising a tuning network connected to said second set of frequency modulator adder addend inputs, said tuning network including means for storing said second digital number and for developing said second digital number signals and means for updating a selected portion of said stored number.

9. An oscillator as recited in claim 6 further comprising a waveform map coupled to receive signals derived from said phase modulator adder sum signals, said waveform map including a predetermined number of storage locations each storing a number, said waveform map for developing signals representing the number stored at the location addressed by said signals derived from said phase modulator adder sum signals.

* * * * *